United States Patent [19]

Matheron et al.

[11] Patent Number: 4,634,899
[45] Date of Patent: Jan. 6, 1987

[54] CURRENT INJECTION LOGIC DEVICE WITH JOSEPHSON DIODE NETWORK

[75] Inventors: Gérard Matheron, Echirolles; Philippe Migny, Seyssins, both of France

[73] Assignee: Commissariat a l'Energie Atomique, France

[21] Appl. No.: 582,398

[22] Filed: Feb. 24, 1984

[30] Foreign Application Priority Data

Mar. 2, 1983 [FR] France .................. 83 03417

[51] Int. Cl.$^4$ .......................... H03K 19/195
[52] U.S. Cl. .................... 307/462; 307/306; 307/476
[58] Field of Search .......... 307/462, 476, 306; 365/162; 357/5

[56] References Cited

U.S. PATENT DOCUMENTS 4,371,796  2/1983  Takada .................. 307/462

FOREIGN PATENT DOCUMENTS 0124330  7/1983  Japan .................. 307/306

OTHER PUBLICATIONS

IBM Technical Disclosure Bulletin, vol. 24, No. 3, 1981, New York—S. M. Faris et al., "Compact Three-Terminal Josephson Switch", pp. 1545-1546, FIGS. 1, 3, p. 1546 from end of that same paragraph.
Japanese Journal of Applied Physics, vol. 19, Supplement 19-1, 1980, Tokyo—S. Takada et al.—"Current Injection Logic Gate with Four Josephson Junctions", pp. 607-611, FIGS. 1, 2; p. 607.

Primary Examiner—John Zazworsky
Attorney, Agent, or Firm—Cesari and McKenna

[57] ABSTRACT

A current injection logic device with Josephson diode network comprises three parallel branches, each having three Josephson diodes in series, the first and last diodes of each of the branches being respectively connected to a first and a second main electrodes, said second main electrode being connected to earth. Apart from said network, the device comprises two inputs respectively connected to two intermediate electrodes between two of the end diodes and the two associated adjacent diodes, and an output connected to the first main electrode. In the case of diodes with a leakage resistance well above their normal resistance, it is possible to define input currents, whereof the major part passes into said end diodes. The device has application to the formation of AND or OR gates.

11 Claims, 7 Drawing Figures

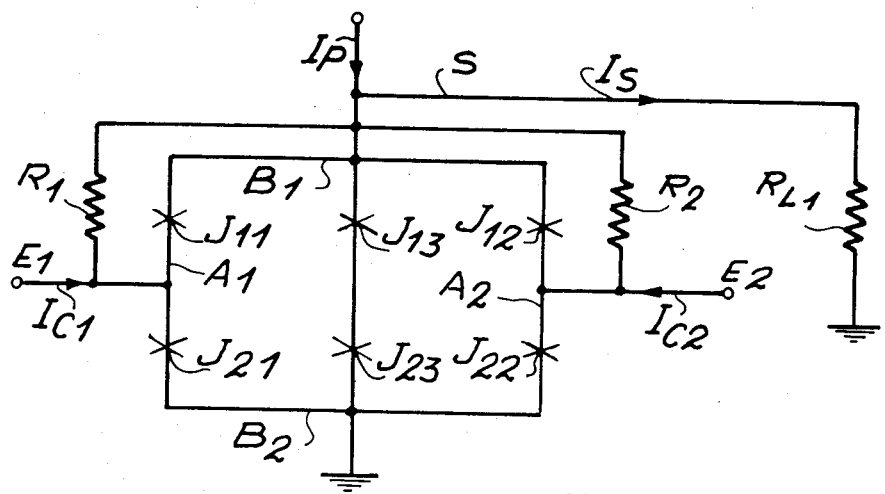
FIG.1 PRIOR ART
FIG.2
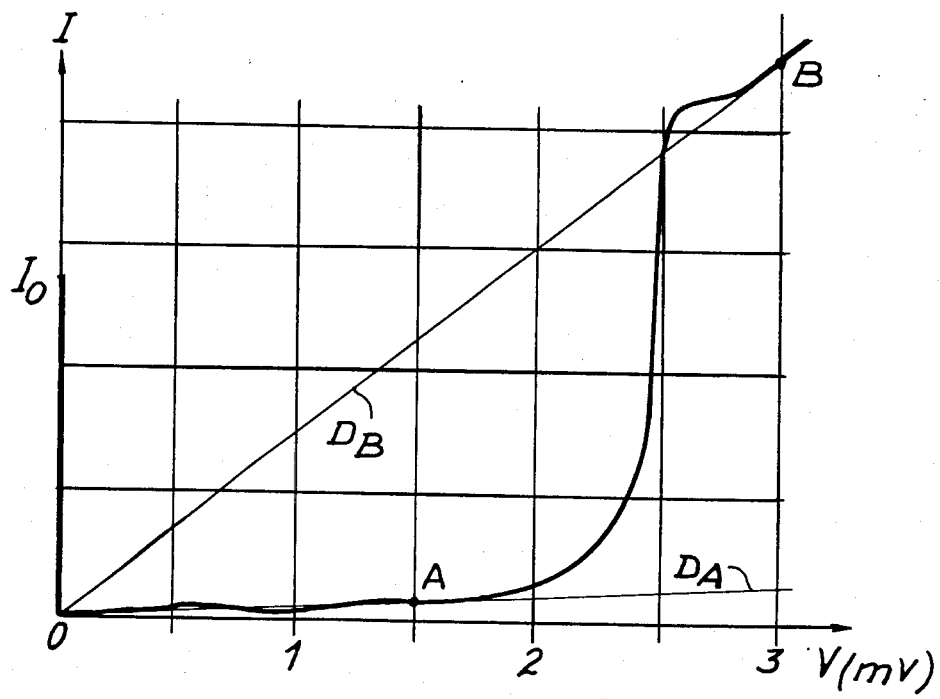

CURRENT INJECTION LOGIC DEVICE WITH JOSEPHSON DIODE NETWORK

BACKGROUND OF THE INVENTION

The present invention relates to a current injection logic device with a Josephson diode network, which are also called Josephson junctions. It more particularly applies to the production of logic AND or OR gates, which can more particularly be used for producing cryogenic computers.

Various types of Josephson effect logic devices are known and are described in the article by T. Gheewala, entitled "Josephson Logic Devices and Circuits", published in the journal IEEE Translations on Electronic Devices, vol. ED27, 1980, pp. 1857 to 1869. One of these is constituted by logic devices having loops provided with inductors, which have a functional role in these devices and which consequently have the disadvantage of occupying a large surface area, which is prejudicial to their use in producing integrated logic circuits.

It is also possible to consider another group of logic devices using assemblies of Josephson diodes and resistors and which offers better integration possibilities. Reference is therefore made to the assembly diagrammatically shown in FIG. 1 and which constitutes a logic AND gate. The latter has a Josephson diode network formed from three parallel-connected branches, and respectively having the pairs of series connected Josephson diodes ($J_{11}$, $J_{21}$), ($J_{12}$, $J_{22}$) and $J_{13}$, $J_{23}$). Diodes $J_{11}$, $J_{12}$, $J_{13}$ are connected to a first main electrode $B_1$ and diodes $J_{21}$, $J_{22}$ and $J_{23}$ are connected to a second main electrode $B_2$, which is earthed. The device also has two inputs $E_1$ and $E_2$. Input $E_1$ is connected to the intermediate electrode $A_1$ between diodes $J_{11}$ and $J_{21}$ and input $E_2$ is connected to intermediate electrode $A_2$ between diodes $J_{12}$ and $J_{22}$. Finally, the AND gate has an output S, which is connected to the first main electrode $B_1$ and which is also closed on its characteristic impedance of equivalent resistor $R_{L1}$. Electrodes $A_1$ and $A_2$ are connected to the first main electrode $B_1$, respectively by shunt resistors $R_1$ and $R_2$, which are respectively smaller than the leakage resistors of diodes $J_{21}$ and $J_{22}$ and also smaller than the equivalent resistor $R_{L1}$. Diodes $J_{11}$, $J_{21}$, $J_{12}$ and $J_{22}$ have the same critical current $I_0$ and diodes $J_{13}$ and $J_{23}$ have the same critical current, which is e.g. equal to $3I_0$.

The devices shown in FIG. 1 operates in the following way. In its initial state, the six Josephson diodes are superconductive. Output S is at logic state 0, no current being supplied to said output. Under the action of a control current of intensity $I_{C1}$ exceeding $2I_0$, injected by input $E_1$ into the device, diodes $J_{11}$ and $J_{21}$ switch from a zero voltage state to a non-zero voltage state corresponding to a high impedance state. Current $I_{C1}$, injected into electrode $A_1$, is then deflected by means of shunt resistor $R_1$ to the first main electrode $B_1$, from which it is divided up between branches respectively having the pairs ($J_{12}$, $J_{22}$) and ($J_{13}$, $J_{23}$). Output S remains at logic state 0.

Under the effect of another control current, the intensity $I_{C2}$ exceeding $2I_0$, injected by input $E_2$ into the device, diodes $J_{12}$ and $J_{22}$ are successively switched and the current $I_{C2}$, injected into electrode $A_2$, is then deflected by means of shunt resistor $R_2$ towards the first main electrode $B_1$, from where it is divided up between the branches having respectively pairs ($J_{11}$, $J_{21}$) and ($J_{13}$, $J_{23}$). Output S still remains at logic state 0. However, under the combined effect of currents $I_{C1}$ and $I_{C2}$, diodes $J_{11}$, $J_{21}$ $J_{12}$ and $J_{22}$ are switched. Currents $I_{C1}$ and $I_{C2}$ are then deflected, respectively by means of shunt resistors $R_1$ and $R_2$, towards the first main electrode $B_1$ and diodes $J_{13}$ and $J_{23}$ are consequently switched into a non-zero voltage state. Therefore currents $I_{C1}$ and $I_{C2}$ are deflected towards output S and produce there an output current $I_S$. Thus, this output then passes to logic state 1. The device shown in FIG. 1 consequently operates as an AND gate.

It is also possible to conceive an OR gate using an assembly of Josephson diodes and resistors. Instead of connecting the intermediate electrodes $A_1$ and $A_2$ of the aforementioned device to the first main electrode $B_1$, via shunt resistors $R_1$ and $R_2$, said intermediate electrodes are connected to the second main electrode $B_2$ via resistors $R_1$ and $R_2$. A polarizing current of intensity $I_P$ equivalent to $4I_0$ for example, is then introduced into the first main electrode $B_1$. The injection of a current having an intensity higher than $I_0$ into one of the inputs $E_1$ and $E_2$, combined with the injection of polarizing current $I_P$, leads to the switching of diodes $J_{11}$, $J_{12}$ and $J_{13}$, which leads to a polarizing current $I_P$ being introduced into output S in order to constitute an output current $I_S$.

Thus, the logic devices of the other group considered and of which two examples have been given hereinbefore, require resistors to operate and consequently have the disadvantage of a relatively long production cycle, because such a cycle must involve several stages relating to the production of the various resistors. Moreover, these devices have another disadvantage. The resistors incorporated therein give them very low damping coefficients and consequently a considerable turn-on delay, which reduces the dynamic performances, i.e. the speed of the devices in question, of. the article by P. Migny and B. Placais, entitled "Turn-on Delay for Josephson Logic Devices with High Damping" and published in Electronic Letters, vol. 18, no. 18, September 1982, pp. 777 to 779.

SUMMARY OF THE INVENTION

The present invention is a current injection logic device with a Josephson diode network, which does not suffer from the aforementioned disadvantages and in particular does not have the shunt resistors of the previously considered devices so that, compared with the latter, the number of production stages and the turn-on delay are reduced.

The present invention therefore specifically relates to a logic device with Josephson diodes, wherein it comprises a first main electrode and a second earthed main electrode, a network of Josephson diodes constituted by M branches connected in parallel, and each having series-connected Josephson diodes, the first and last Josephson diodes of each of the M branches being respectively connected to the first and second main electrodes, M being an integer at least equal to 2, K branches of said M branches each having N Josephson diodes, which thus have N−1 intermediate electrodes, K being an integer at least equal to one and less than the number M, N being an integer at least equal to three, the M−K remaining branches each having at least one Josephson diode, L inputs respectively connected to the L intermediate electrodes of the K branches and used for the injection of electric currents into said network, L being an integer at least equal to 1, and an output connected to the first main electrode and which is to be raised to a logic level determined as a function of the values of said currents.

Thus, as a function of the values of these currents, the various Josephson diodes either switch or do not switch, i.e. pass from a zero voltage state with a purely reactive impedance to a non-zero voltage state with a high impedance, or remain in the zero voltage state. Under these conditions, the output can then remain at logic level zero, no current being supplied to said output, or can be raised to logic level 1, a current then being supplied to said output.

More specifically, an intermediate electrode connected to an input, divides the branch in which it is located to first and second parts, the first part being able to have an electrical resistance which is well above that of the second part, when an appropriate current is injected into the input, this being made possible by the non-linearity of the current-voltage characteristics of a Josephson diode. The first part is then traversed by a current having an intensity well below the intensity of the current passing through the second part. Thus, the output can be passed from one logic state to another by an appropriate choice of the inputs and the injected currents. There is then no need for a shunt resistor.

The device according to the invention makes it possible to realize the various functional stages of the logic gates (detection, amplification and insulation).

The number L is obviously at the most equal to $K \cdot (N-1)$ and, for each of the K branches, there can be between one and $N-1$ inputs.

According to a special feature of the logic device according to the invention, the L intermediate electrodes, to which are respectively connected the L inputs, are intermediate electrodes of the same rank, respectively belonging to the L different branches, each of said intermediate electrodes of the same rank being constituted by the intermediate electrode immediately adjacent to one of the two extreme Josephson diodes of the branch to which said intermediate electrode belongs.

Thus, it is possible to increase the asymmetry of each of the branches associated with a current input and which is a function of the position within the considered branch of the intermediate electrode connected to the current input. For insulation reasons, a large asymmetry is preferable.

According to another special feature, the $M-K$ remaining branches all have the same number of Josephson diodes. Preferably, each of the $M-K$ remaining branches has N Josephson diodes. The most satisfactory device from the integration and dynamic performance standpoints is that for which $M-K$ is equal to 1 with N Josephson diodes in the remaining branch.

According to another special feature, the Josephson diodes of the K branches all have the same critical current $I_0$, the same normal resistance $R_n$ and the same leakage resistance $R_J$.

According to another special feature, the first Josephson diodes respectively belonging to the $M-K$ remaining branches have the same critical current and the sum of the critical currents of said first Josephson diodes belonging to the $M-K$ remaining branches is equal to $kI_o$, k being a number exceeding 1 and preferably these $M-K$ remaining branches all have the same number of Josephson diodes, the Josephson diodes of the same rank, belonging respectively to the $M-K$ remaining branches, having the same critical current and for these $M-K$ remaining branches, each of the sums of the critical currents of the Josephson diodes of the same rank is equal to $kI_o$, k being a number greater than 1.

The device according to the invention can have K inputs respectively associated with K branches. The number K can then be equal to $N-1$. In the case where K is an odd number, for reasons of operating symmetry, it is possible to conceive a device in which the Josephson diodes forming the branches associated with the K inputs all have the same critical current $I_0$, and which has e.g. 2X other branches, whereof each Josephson diode has a critical current equal to $kI_0/(2X)$, X being an integer at least equal to 1.

The logic device according to the invention is applicable to the realization of AND or OR logic gates on the basis of the same Josephson diode network, the distinction between the logic gates produced being based solely on the choice of the positions of the inputs provided for the injection of the electric currents.

Preferably, in the case where the Josephson diodes of the K branches all have the same critical current $I_0$, the same normal resistance $R_n$ and the same leakage resistance $R_J$, in which the $M-K$ remaining branches all have the same number of Josephson diodes, in which the Josephson diodes of the same rank belonging respectively to the $M-K$ remaining branches have the same critical current and in which, for the $M-K$ remaining branches, each of the sums of the critical currents of said Josephson diodes have the same rank belonging to $M-K$ remaining branches is equal to $kI_0$, K being a number greater than one, the device according to the invention can, on the one hand, serve to form an AND gate and then have K inputs, the number K being at least equal to 2, each input being associated with one of the K branches and connected to the intermediate electrode immediately adjacent to the first Josephson diode of the branch with which is associated said input, and the number N and Josephson diodes of the K branches being chosen in such a way that the quantity $(N-1)R_J/R_n$ is greater than one, i.e. in such a way that $(N-1)R_J$ is several times $R_n$.

In a special embodiment of the AND gate in question, a polarizing current can be injected, via the first main electrode, into the said AND gate, so as to increase the gain of the latter.

The device according to the invention can also serve to constitute an OR gate, when it then has K inputs, each input being associated with one of the K branches and connected to the intermediate electrode immediately adjacent to the final Josephson diode of the branch with which said input is associated, the number N and the Josephson diodes of the K branches being chosen in such a way that the quantity $(N-1)R_J/R_N$ is greater than 1, a polarizing current being injected via the first main electrode, into the OR gate in question and the intensity $I_P$ of said current proves the following inequation:

$$I_P < (K+k)I_0$$

It is also possible to use a polarizing current of intensity $I_P$ such that:

$$(K+k-1)I_0 < I_P < (K+k)I_0$$

BRIEF DESCRIPTION OF THE DRAWINGS

The invention is described in greater detail hereinafter relative to non-limitative embodiments and with reference to the attached drawings, wherein shown:

FIG. 1: a diagrammatic view of the logic AND gate having shunt resistors and which has already been described.

FIG. 2: a graph showing the current-voltage characteristic of a Josephson diode.

DETAILED DESCRIPTION OF THE PREFERRED EMBODIMENTS

FIG. 2 shows the current-voltage characteristic of a Josephson diode which can be used in the present invention. The voltages V are plotted on the abscissa and are expressed in mV. The currents I are plotted on the ordinate. The characteristic of the Josephson diode in question firstly rises in a substantially linear manner from the origin O to a point A, i.e. along a straight line $D_A$ passing through points O and A, it then rises strongly to become tangential, at a point B, to a straight line $D_B$ passing through origin O, said line having a positive slope and the characteristic subsequently coinciding therewith. For example, the Josephson diode in question can have a critical current $I_0$ of approximately 100 $\mu A$ and the ratio of the directional coefficient or slope of line $D_A$, which is equal to the leakage resistance $R_J$ of the Josephson diode, with the directional coefficient or slope of line $D_B$, is equal to the normal resistance $R_n$ of said Josephson diode, can be approximately 10. The present invention utilizes the nonlinearity of the characteristic of a Josephson diode, like that shown in FIG. 2, and also utilizes the fact that it is possible to find Josephson diodes with a high $R_J/R_n$ ratio.

Figure 3:
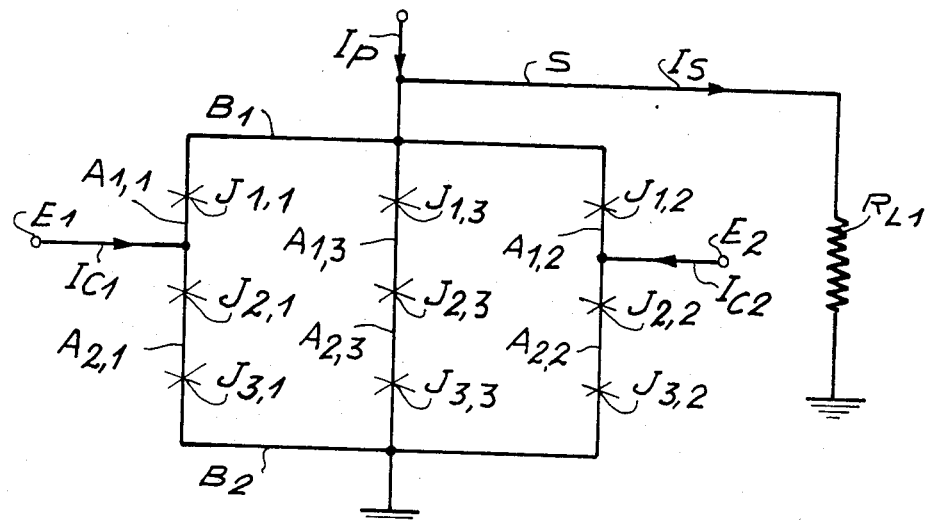
FIG. 3: a diagrammatic view of a special embodiment of the device according to the invention, constituting a logic AND gate with two inputs.

FIG. 3 diagrammatically shows a special embodiment of the logic device according to the invention and constituting an AND gate with two inputs.

It comprises a first main electrode $B_1$ and a second earthed main electrode $B_2$, a network of Josephson diodes constituted by three parallel-connected branches and each having three series-connected Josephson diodes, two inputs $E_1$ and $E_2$ for the injection of an electric current into the network and an output S connected to the first main electrode $B_1$.

The ith branch, the subscript i varying between 1 and 3, has three Josephson diodes $J_{1,i}$, $J_{2,i}$ and $J_{3,i}$, diodes $J_{1,i}$ and $J_{2,i}$ being connected by an intermediate electrode $A_{1,i}$, whilst diodes $J_{2,i}$ and $J_{3,i}$ are connected by another intermediate electrode $A_{2,i}$. Moreover, diodes $J_{1,1}$, $J_{1,2}$ and $J_{1,3}$ are connected to the first main electrode $B_1$ and diodes $J_{3,1}$, $J_{3,2}$ and $J_{3,3}$ are connected to the second main electrode $B_2$. Input $E_1$ is connected to the intermediate electrode $A_{1,1}$, immediately adjacent to the first Josephson diode $J_{1,1}$ of the first branch and the other input $E_2$ is connected to the intermediate electrode $A_{1,2}$ immediately adjacent to the first Josephson diode $J_{1,2}$ of the second branch. Moreover, output S is closed on a load impedance $R_{L1}$. In order to have a symmetry in the structure of the AND gate shown in FIG. 3, the third branch having diodes $J_{1,3}$, $J_{2,3}$ and $J_{3,3}$ and which is not associated with any input, can be positioned between the first and second branches which are respectively associated with inputs $E_1$ and $E_2$. In the case shown in FIG. 3, the numbers N, K, L and M are respectively 3, 2, 2, and 3.

Diodes $J_{1,1}$, $J_{2,1}$, $J_{3,1}$, $J_{1,2}$, $J_{2,2}$, and $J_{3,2}$ are produced in such a way that they have the same critical current $I_0$, the same leakage resistance $R_J$, the same normal resistance $R_n$ and a high $R_J/R_n$ ratio of e.g. approximately 10. Moreover, diode $J_{1,3}$, $J_{2,3}$, $J_{3,3}$ are produced in such a way that they all have a critical current equal to $kI_0$, k being a number greater than 1 and e.g. equal to 2.

The asymmetry of the branches having a current input, i.e. due to the fact that on either side of the intermediate electrode to which the current input is connected there are different numbers of Josephson diodes, makes it possible to greatly unbalance the resistive ratio of the branches. Thus, for example, on considering the first branch having Josephson diodes $J_{1,1}$, $J_{2,1}$ and $J_{3,1}$, as a result of the non-linearity of the current-voltage characteristic of the Josephson diodes, it is possible to inject through input $E_1$ a current $I_{C1}$, whose intensity is sufficiently high for the resistance of diode $J_{1,1}$ to assume the value $R_n$, and the resistances of diodes $J_{2,1}$ and $J_{3,1}$ both assume the value $R_J$, whilst being sufficiently low for the resistances of diodes $J_{1,1}$, $J_{2,1}$, $J_{3,1}$ not to all assume the value $R_n$. Due to the high value of the $R_J/R_n$ ratio, the branch in question is then subdivided by intermediate electrode $A_{1,1}$ into two portions, whose resistances clearly differ, the portion containing diode $J_{1,1}$ having a resistance $R_n$ and the portion containing diodes $J_{2,1}$ and $J_{3,1}$ having a resistance equal to $2R_J$, i.e. to $20R_n$, i.e. a 20 times higher resistance than the resistance corresponding to diode $J_{1,1}$. The injected current is consequently subdivided into two portions in the first branch, namely a portion whose intensity is $(20/21)I_{C1}$ and which circulates in the part containing diode $J_{1,1}$, and another portion whose intensity is $(1/21)I_{C1}$ and which circulates in the part containing diodes $J_{2,1}$ and $J_{3,1}$. In order to obtain these results, it is merely necessary to inject through input $E_1$ a current of intensity $I_{C1}$ approximately equal to $2I_0$. Obviously the same reasoning can be used in connection with the second branch containing diodes $J_{1,2}$, $J_{2,2}$ and $J_{3,2}$.

The operation of the device shown in FIG. 3 is then as follows. In the initial state thereof, the Josephson diodes are all superconductive. Output S is at logic state 0 and no current is supplied thereto. By injecting a current of intensity $I_{C1}$ equal to $2I_0$ through input $E_1$ of the device, located on the first branch, diodes $J_{1,1}$, $J_{2,1}$ and $J_{3,1}$ switch from the zero voltage state to non-zero voltage states corresponding to the resistive states indicated hereinbefore and, as has already been explained, most of the current of intensity $I_{C1}$ injected into electrode $A_{1,1}$ is then deflected towards the first main electrode $B_1$, from which it is subdivided between the two other branches. Output S remains at logic state zero.

Under the effect of a control current of intensity $I_{C2}$ equal to $2I_0$, injected through input $E_2$ into the device, said input $E_2$ being located on the second branch, diodes $J_{1,2}$, $J_{2,2}$ and $J_{3,2}$ switch, as has been explained hereinbefore with reference to diodes $J_{1,1}$, $J_{2,1}$ and $J_{3,1}$, and most of the current $I_{C2}$ is then transmitted towards the first main electrode $B_1$, from which it is split up between the two other branches. Output S still remains at logic state 0 in this case. However, under the combined effect of currents $I_{C1}$ and $I_{C2}$, diodes $J_{1,1}$, $J_{2,1}$ and $J_{3,1}$ and $J_{1,2}$, $J_{2,2}$, $J_{3,2}$ switch in the manner described hereinbefore, most of the currents $I_{C1}$ and $I_{C2}$ being then deflected towards the first main electrode $B_1$, which has the effect of switching diodes $J_{1,3}$, $J_{2,3}$ and $J_{3,3}$ into a non-zero voltage state. Most of the currents $I_{C1}$ and $I_{C2}$ is then deflected towards output S, where an output current $I_S$ is produced. Thus, this output passes to logic state 1.

Thus, the device shown in FIG. 3 functions as an AND gate having a gain $I_S/I_{C1}$ (or $I_S/I_{C2}$) close to 2. In order to obtain a higher gain, it is merely necessary to polarize the AND gate by injecting an electric current $I_P$ into the first main electrode.

Obviously, for the branches having inputs, it is possible to provide a number N of Josephson diodes exceeding 3, with a diode $J_{1,i}$ on one side of each intermediate electrode connected to an input and N−1 diodes $J_{2,i}$, ... $J_{N,i}$ on the other side of said intermediate electrode, the subscript i assuming the values 1 and 2. The higher the number N, the better the device functions because, by generalizing the results obtained hereinbefore, the fraction of the intensity $I_{C1}$ of the current injected through input $E_1$ for example and which is transmitted to the first main electrode $B_1$ when the diodes are switched (into a resistive state $R_n$ for diode $J_{1,1}$ and into a resistive state $R_J$ for diodes $J_{2,1}, \ldots J_{N,1}$) is equal to:

$$\alpha I_{C1}/(1+\alpha) \text{ with : } \alpha=(N-1)R_J/R_n$$

In general terms, the values of N and/or $R_J/R_n$ are selected in such a way that the value of $\alpha$ preferably exceeds 9 and is e.g. approximately 20.

Figure 4:
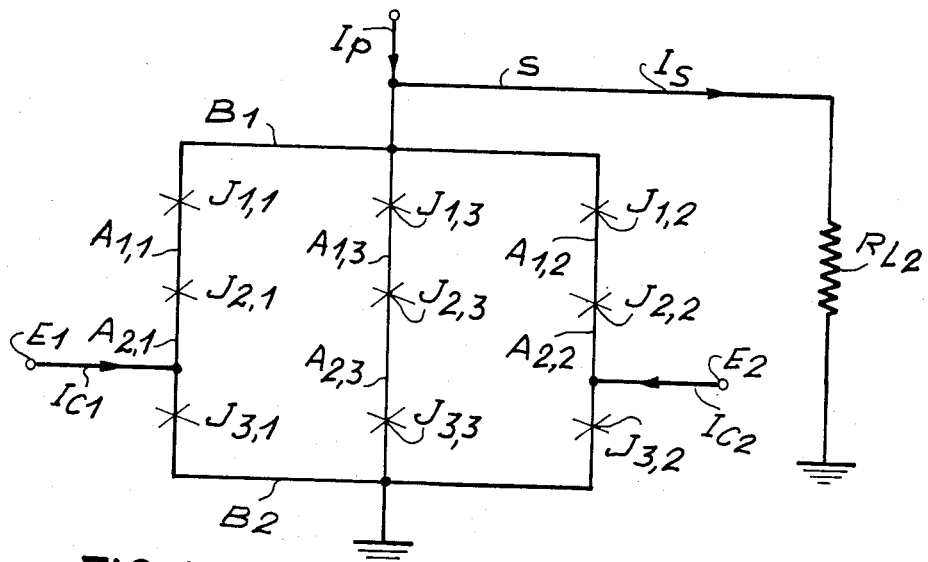
FIG. 4: a diagrammatic view of another special embodiment of the device according to the invention, constituting a logic OR gate with two inputs.

FIG. 4 diagrammatically shows another embodiment of the device according to the invention for constituting a logic OR gate with two inputs $E_1$ and $E_2$. This OR gate has a network of Josephson diodes identical to the network forming part of the AND gate of FIG. 3. The second main electrode $B_2$ is earthed and the output S is closed on a load impedance $R_{L2}$. The two inputs $E_1$ and $E_2$ are no longer respectively connected to the intermediate electrodes $A_{1,1}$ and $A_{1,2}$ as was the case for the AND gate of FIG. 3. In the case of the OR gate of FIG. 4, these two inputs $E_1$ and $E_2$ are respectively connected to the intermediate electrodes $A_{2,1}$ and $A_{2,2}$. Moreover, the OR gate of FIG. 4 is polarized by a current of intensity $I_P$, injected into said gate by the first main electrode $B_1$, and such that the intensity $I_P$ proves the following double inequation:

$$(1+k)I_0 < I_P < (2+k)I_0$$

$I_0$ being equal, as in the case of FIG. 3, to the critical current of the Josephson diodes $J_{1,i}$, $J_{2,i}$, $J_{3,i}$ the subscript i assuming the value 1 and 2 and $kI_0$ being equal to the critical current of the Josephson diodes $J_{1,3}$, $J_{2,3}$ and $J_{3,3}$, k being e.g. equal to 2.

The device shown in FIG. 4 operates as follows. In the initial state, all the Josephson diodes are superconductive. No current is supplied to the output S, which is consequently at logic level 0 and remains there for as long as no current is injected into the device by at least one of the electrodes $A_{2,1}$ and $A_{2,2}$. When a control current $I_{C1}$ of intensity equal to $2I_0$ is injected into the device at input $E_1$ by electrode $A_{2,1}$, said current brings about the switching of the Josephson diodes of the branch reached by it, diode $J_{3,1}$ passing into a resistive state $R_n$ and diodes $J_{1,1}$ and $J_{2,1}$ passing into a resistive state $R_J$, whilst most of the injected intensity is passed to the second main electrode $B_2$, and consequently to earth. The polarizing current of intensity higher than $(1+k)I_0$ then switches the Josephson diodes $J_{1,2}$ and $J_{1,3}$, as a result of which the polarizing current $I_P$ is supplied to output S to constitute the output current $I_S$. The output is then raised to logic level 1. The same reasoning can be applied to a current $I_{C2}$ injected at input $E_2$ by electrode $A_{2,2}$, which brings about the switching to the non-zero voltage state of junctions $J_{1,2}$, $J_{2,2}$, $J_{3,2}$ and whereof most of the intensity is then directed to earth by electrode $B_2$. Thus, the device of FIG. 4 functions as an OR gate.

Figure 5:
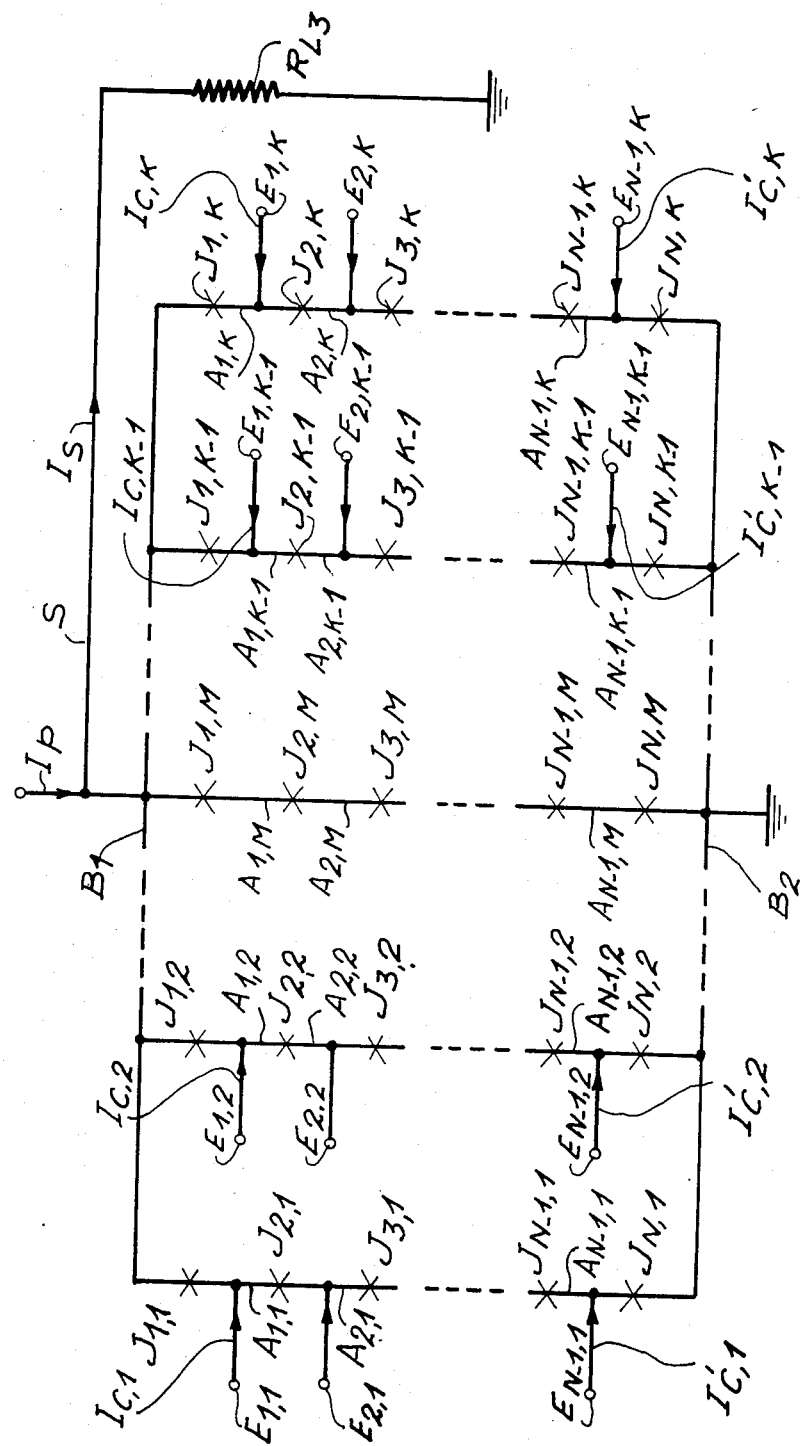
FIGS. 5 and 6: diagrammatic views of other embodiments of the device according to the invention, able to form logic gates or either the AND type or the OR type with K inputs.

FIG. 5 diagrammatically shows another embodiment of the device according to the invention with N·M Josephson diodes and able to form a logic AND or a logic OR gate with K inputs, the numbers N and M both being at least equal to 3 and the number K being at least equal to 2 and less than M. For example, the number K is equal to M−1. For information purposes, FIG. 5 shows an example in which the numbers K and M are respectively equal to 4 and 5.

The embodiment of FIG. 5 comprises a first main electrode $B_1$ and a second earthed main electrode $B_2$, a network of Josephson diodes constituted by M parallel-connected branches and each having N series-connected Josephson diodes, (N−1)·K inputs $E_{i,j}$, the subscript i varying between 1 and N−1 and the subscript j varying between 1 and K, said inputs being used for injecting currents into the network and an output S connected to the first main electrode $B_1$.

The jth branch, the subscript j varying between 1 and M, has N Josephson diodes $J_{1,j}$, $J_{2,j}$, ... $J_{N-1,j}$ and $J_{N,j}$, said N Josephson diodes thus having N−1 intermediate electrodes. Diodes $J_{1,j}$ and $J_{2,j}$ are connected by an intermediate electrode $A_{1,j}$, diodes $J_{2,j}$ and $J_{3,j}$ are connected by an intermediate electrode $A_{2,j}$, and so on, the diodes $J_{N-1,j}$ and $J_{N,j}$ are connected by an intermediate electrode $A_{N-1,j}$. Moreover, all the first Josephson diodes $J_{1,1}$, $J_{1,2}$ ... $J_{1,M}$ are connected to the first main electrode $B_1$ and all the last Josephson diodes $J_{N,1}$, $J_{N,2}$ ... $J_{N,M}$ are connected to the second main electrode $B_2$. The current inputs are associated with the K first branches, the number K being equal to M−1 in the considered embodiment, the last branch M having no input. In the jth branch, the subscript j varies between 1 and K, so that the N−1 inputs $E_{1,j}$, $E_{2,j}$ ... $E_{N-1,j}$ are respectively connected to the N−1 intermediate electrodes $A_{1,j}$, $A_{2,j}$, ... $A_{N-1,j}$. In addition, output S is closed on a load impedence $R_{L3}$.

The N·K Josephson diodes of the K first branches having current inputs are produced in such a way that they have the same critical current $I_0$, the same leakage resistance $R_J$ and the same normal resistance $R_n$. They are also produced and/or the number N is chosen in such a way that the quantity $(N-1)R_J/R$ hd n exceeds 9, and is e.g. approximately 20. To this end it is merely necessary e.g. for the number N to be equal to 3 and for the $R_J/R_n$ ratio to be equal to 10. Moreover, the N diodes $J_{1,M}$, $J_{2,M}$, ..., $J_{N,M}$ belonging to the Mth branch with which no input is associated, are produced in such a way that these diodes all have a critical current equal to $kI_0$, k being a number greater than one and e.g. equal to 2K−3.

By considering a special branch associated with inputs, the invention makes use of the idea referred to hereinbefore of injecting a current with an appropriate intensity into an immediate electrode of this branch, the intermediate electrode preferably being chosen in such a way that on either side thereof there are very different numbers of Josephson diodes, thus, this current is preferably injected into one of the two intermediate electrodes respectively adjacent to the end Josephson diodes (i.e. the first and last Josephson diodes of the branch in question), in such a way that the portions of said branch located on either side of the intermediate electrode into which the current is injected have, after injecting the current, very different electrical resistances, so that one of the two portions has a resistance higher than that of the other portion (which is possible in view of the non-linearity of the current-voltage characteristic of the Josephson diodes).

The device diagrammatically shown in FIG. 5 can operate as a logic AND gate. In the initial state, all the Josephson diodes are superconductive. Output S is at logic level 0 and no current is supplied to said output. The injection of $K-1$ control currents respectively into the $K-1$ intermediate electrodes $A_{1,1}, A_{1,2}, \ldots, A_{1,K}$, each of these currents having an intensity equal to $2I_0$, does not bring about any change in the logic state of the output, but the injection of K control currents $I_{C,1}, I_{C,2} \ldots, I_{C,K}$ respectively into the intermediate electrodes $A_{1,1}, A_{1,2}, \ldots, A_{1,K}$, each of the said currents having an intensity equal to $2I_0$, ensures that output S passes to logic state 1, an electric current $I_S$ then being supplied to said output.

Thus, the injection of $K-1$ currents, each having an intensity equal to $2I_0$, respectively by intermediate electrodes $A_{1,1}, A_{1,2}, \ldots, A_{1,K-1}$ for example, brings about the switching of the Josephson diodes of the branches respectively associated with the intermediate electrodes, in the manner explained in connection with the description of FIG. 3, and most of each of these currents is passed into the first main electrode $B_1$, the resulting intensity being lower than $(2K-2)I_0$ and the resulting current is then transmitted into the Kth branch and the Mth branch, without switching the diodes of these two branches. However, the injection of K currents, each having an intensity equal to $2I_0$ respectively into intermediate electrodes $A_{1,1}, A_{1,2}, A_{1,K}$, brings about the switching of diodes $J_{1,1}, J_{1,2}, \ldots, J_{1,K}$ to a resistive state $R_n$, and the other Josephson diodes of these K branches to a resistive state $R_J$, and most of each of the injected currents is passed into the first main electrode $B_1$, the intensity of the resulting current being close to $2KI_0$, which exceeds $(2K-3)I_0$, and consequently diode $J_{1,M}$ is switched, the resulting current then passing into output S.

However, the device diagrammatically shown in FIG. 5 can also operate as a logic OR gate. For this purpose, an electric current of intensity $I_P$ is injected by the first main electrode $B_1$. The intensity $I_P$ proves the following double inequation:

$$(K+k-1)I_0 < I_P < (K+k)I_0$$

As hereinbefore, the number k is equal to $2K-3$. However, the value 2 for the number k would also be suitable, no matter what the value of the number K. The operation as a logic OR gate is obtained by injecting currents of respective intensities $I'_{C,1}, I'_{C,2}, \ldots I'_{C,K}$ by inputs $E_{N-1,1}, E_{N-1,2}, \ldots, E_{N-1,K}$, respectively associated with the intermediate electrodes $A_{N-1,1}$, $A_{N-1,2}, \ldots, A_{N-1,K}$. Starting from an initial state in which the Josephson diodes are superconductive, no current is supplied to output S, which is consequently at logic level 0 and remains there whilst no current is injected into the device by at least one of the electrodes $A_{N-1,1}, A_{N-1,2}, \ldots, AN_{-1K}$, respectively located between diodes $J_{N-1,1}, J_{N-1,2}, \ldots, J_{N-1,K}$ and $J_{N,1}, J_{N,2}, \ldots, J_{N,K}$. When a control current of intensity equal to $2I_0$ is injected into the device by at least one of the intermediate electrodes $A_{N-1,1}, AN_{-1,2}, \ldots, A_{N-1,K}$, said current brings about the switching of the Josephson diodes of the branch into which it is injected, the last diode of said branch passing through a resistive state $R_n$, and the other diodes of this branch passing to a resistive state $R_J$ and most of the current then being passed to the second main electrode $B_2$ and consequently to earth. On then assuming that the current is injected into the first branch, the polarizing current of intensity higher than $(K+k-1)I_0$ (the number k being equal to $2K-3$) brings about the switching of the Josephson diodes $J_{1,2}, \ldots, J_{1,K}$ and as a result it is transmitted into output S to form output current $I_S$. The output is thus raised to logic level 1. When no current is injected into the device, the polarizing current of intensity lower than $(K+k)I_0$ is inadequate to bring about the switching of diodes $J_{1,1}, J_{1,2}, \ldots, J_{1,K}$). Thus, the operation is indeed of the OR type.

Figure 6:
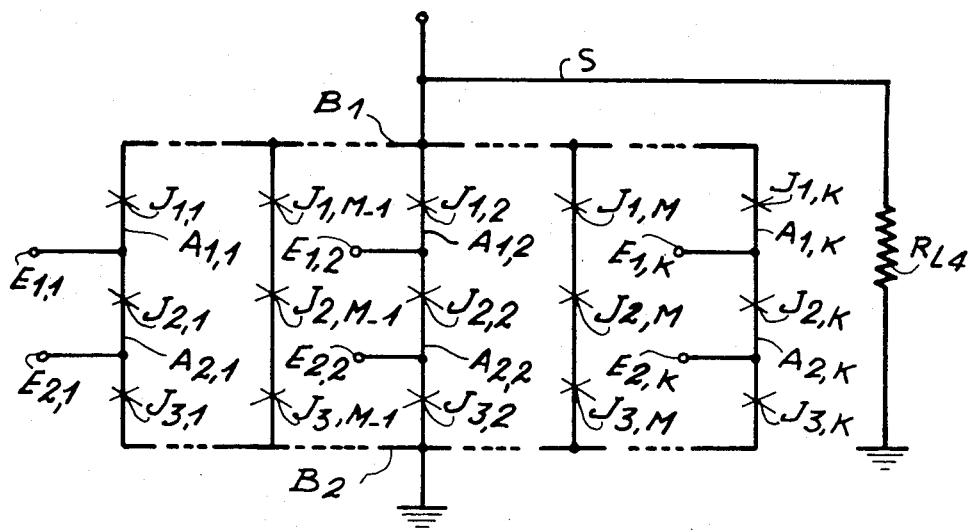

FIG. 6 diagrammatically shows another embodiment of the device according to the invention having more than one branch not provided with an input. The device of FIG. 6 is identical to that of FIG. 5, except with respect to the number of branches not associated with inputs. The device of FIG. 6 has M parallel-connected branches and N series-connected Josephson diodes, the number N being assumed as equal to 3 to simplify FIG. 6. Among these M branches, there are K branches associated with inputs and $M-K$ branches not associated with inputs.

For example, the number K is equal to $M-2$. For reasons of clarity, it is assumed that the numbers M and K are respectively equal to 5 and 3, so that the device has a symmetrical structure in which the branches not provided with inputs are inserted between the branches provided with inputs. Output S is obviously connected to the first main electrode $B_1$ and is closed on a load impedance $R_{L4}$. The Josephson diodes of the branches of rank $1, 2, \ldots, K$, with which are associated the inputs, are realized in such a way that they all have the same critical current $I_0$, the same leakage resistance $R_J$ and the same normal resistance $R_n$. Moreover, the Josephson diodes of the $M-K$ remaining branches are realized in such a way that they all have the same critical current equal to $kI_0/(M-K)$, i.e. in the present case to $kI_0/2$, k being e.g. equal to $2K-3$. The $M-K$ branches not provided with inputs are then equivalent to a single branch provided with N Josephson diodes, each having a critical current equal to $kI_0$.

The device according to the invention has a much higher sensitivity and better dynamic performance than the devices using shunt resistors, which were considered at the start of the description. Thus, the switching of the device according to the invention can be brought about rapidly because, as there are no shunt resistors, the portion of the branch ensuring the detection can be slightly damped, which reduces the so-called turn-on delay and the rise time (or time of establishing the output) conventionally defined as the product $Z_C \cdot C_J$, in which $Z_C$ is the output charge of the device and $C_J$ is the capacitance of the Josephson diodes used, is reduced due to the presence of several Josephson diodes in series in the branch or branches not provided with current inputs.

Moreover, the device according to the invention operates in a very different manner from the known logic devices with Josephson diodes, in the sense that it take advantage of the non-linearity of the current-voltage characteristic of the Josephson diodes, permitting a passage of the leakage resisnance $R_J$ to the normal resistance $R_n$ of said diodes.

Figure 7:
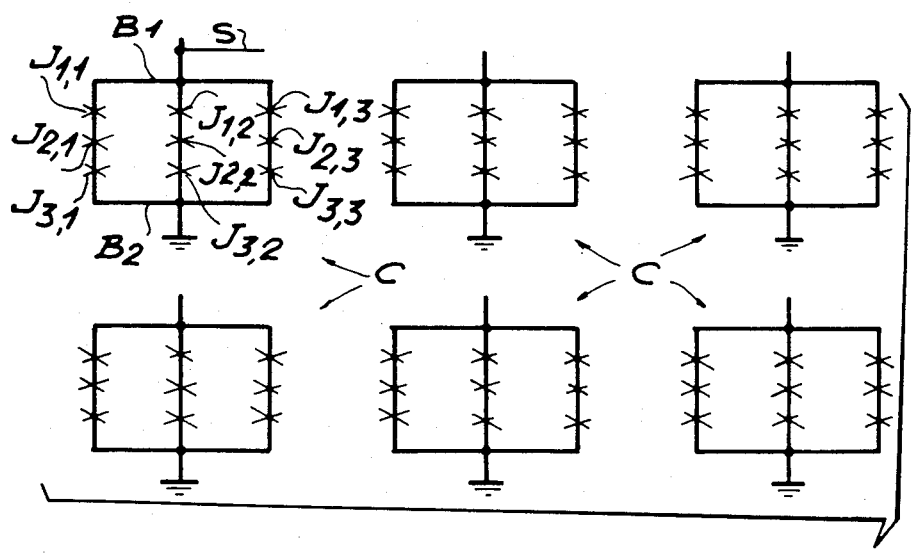
FIG. 7: a diagrammatic view of a basic structure which can be realized as a result of the present invention and which makes it possible to produce logic circuits.

Finally, the present invention makes it possible when using the same basic device (e.g. that shown in FIG. 5) to obtain both a logic OR function and a logic AND function. This is possible by simply modifying the current injection points, as has been seen in connection with the description of FIG. 5. This clearly shows the advantage of the device according to the invention for the design and fitting of logic circuits. Thus, there can be a pre-positioning of the basic structure in the manner of so-called pre-diffused circuits, said structure consisting of a plurality of cells whereof one example is given hereinafter, each cell only being individualized by the connection mode making it possible to realize either an OR function, or an AND function. FIG. 7 diagrammatically shows an example of the basic structure with a plurality of cells C arranged in a regularly juxtaposed manner, each cell having e.g. three parallel-connected branches and which are respectively provided with three series-connected Josephson diodes, $(J_{1,1}, J_{2,1}, J_{3,1})$, $(J_{1,2}, J_{2,2}, J_{3,2})$, $(J_{1,3}, J_{2,3}, J_{3,3})$, diodes $J_{1,1}$, $J_{1,2}$ and $J_{1,3}$ being connected to a first main electrode $B_1$, which is itself provided with an ouput S and diodes $J_{3,1}$, $J_{3,2}$ and $J_{3,3}$ being connected to a second earthed main electrode $B_2$. Thus, for example, these cells are in accordance with the Josephson diode network shown in FIGS. 3 or 4. The cells are then interconnected as a function of the type of logic circuit to be produced, the output of a given cell constituting the input of one or more other cells.

What is claimed is:

1. A logic device with Josephson diodes, wherein it comprises a first main electrode and a second earthed main electrode, a network of Josephson diodes constituted by M branches connected in parallel, and each having series-connected Josephson diodes, the first and last Josephson diodes of each of said M branches being respectively connected to the first and second main electrodes, M being an integer at least equal to 2, K branches of said M branches each having N Josephson diodes, which thus have N−1 intermediate electrodes, K being an integer at least equal to one and less than the number M, N being an integer at least equal to three, the M−K remaining branches each having at least one Josephson diode, L inputs respectively connected to L intermediate electrodes of said K branches and used for the injection of electric currents into said network, L being an integer at least equal to 1, and an output connected to the first main electrode and which is to be raised to a logic level determined as a function of the values of said currents.

2. A logic device according to claim 1, wherein said L intermediate electrodes, to which are respectively connected the L inputs, are intermediate electrodes having the same rank, respectively belonging to L different branches, each of said intermediate electrodes of the same rank being constituted by the intermediate electrode immediately adjacent to one of the two extreme Josephson diodes of the branch to which said intermediate electrode belongs.

3. A logic device according to claim 1, wherein the M−K remaining branches all have the same number of Josephson diodes.

4. A logic device according to claim 3, wherein each of the M−K remaining branches has N Josephson diodes.

5. A logic device according to claim 1, wherein the Josephson diodes of the K branches all have the same critical current $I_0$, the same normal resistance $R_n$ and the same leakage resistance $R_J$.

6. A logic device according to claim 5, wherein the first Josephson diodes respectively belonging to the M−K remaining branches have the same critical current and wherein the sum of the critical currents of the first Josephson diodes belonging to the M−K remaining branches is equal to $kI_0$, k being a number greater than 1.

7. A logic device according to claim 6, wherein the M−K remaining branches all have the same number of Josephson diodes, wherein the Josephson diodes having the same rank and respectively belonging to the M−K remaining branches have the same critical current and wherein, for these M−K remaining branches, each of the sums of the critical currents of the Josephson diodes of the same rank is equal to $kI_0$, k being a number greater than one.

8. A logic device according to claim 7, wherein as the device is intended to constitute an AND gate, said device has K inputs, the number K being at least equal to 2, each input being associated with one of the K branches and connected to the intermediate electrode imemdiately adjacent to the first Josephson diode of the branch with which said input is associated and wherein the number N and the Josephson diodes of the K branches are chosen in such a way that the quantity $(N-1)R_J/R_n$ is high compared with one.

9. A logic device according to claim 8, wherein a polarizing current is injected, via the first main electrode, into the AND gate in question, so as to increase the gain of said gate.

10. A logic device according to claim 7, wherein as the device as constituting an OR gate, has K inputs, each input being associated with one of the K branches and connected to the intermediate electrode immediately adjacent to the final Josephson diode of the branch with which said input is associated, the number N and the Josephson diodes of the K branches being chosen in such a way that the quantity $(N-1)R_J/R_n$ is greater than 1, a polarizing current being injected via the first main electrode, into the OR gate in question and the intensity $I_P$ of said current being such that:

$$I_P < (K+k)I_0.$$

11. An application of the logic device according to claim 1 to the production of logic AND gates and OR gates using the same network of Josephson diodes, the distinction between the logic gates resulting solely from the choice of the positions of the inputs provided for the injection of the electric currents.

* * * * *